(12) United States Patent
Lee

(10) Patent No.: US 11,999,257 B2
(45) Date of Patent: Jun. 4, 2024

(54) BATTERY MANAGEMENT METHOD, BATTERY DEVICE, AND VEHICLE COMPRISING BATTERY DEVICE

(71) Applicant: LG CHEM, LTD., Seoul (KR)

(72) Inventor: Hyeok Jae Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 616 days.

(21) Appl. No.: 17/276,716

(22) PCT Filed: Jan. 3, 2020

(86) PCT No.: PCT/KR2020/000126
§ 371 (c)(1),
(2) Date: Mar. 16, 2021

(87) PCT Pub. No.: WO2020/141938
PCT Pub. Date: Jul. 9, 2020

(65) Prior Publication Data
US 2022/0032814 A1    Feb. 3, 2022

(30) Foreign Application Priority Data
Jan. 4, 2019  (KR) .................. 10-2019-0001322

(51) Int. Cl.
*B60L 58/13*    (2019.01)
*B60L 58/16*    (2019.01)
(Continued)

(52) U.S. Cl.
CPC .............. *B60L 58/13* (2019.02); *B60L 58/16* (2019.02); *G01R 31/3842* (2019.01);
(Continued)

(58) Field of Classification Search
None
See application file for complete search history.

(56) References Cited

U.S. PATENT DOCUMENTS 6,304,061 B1   10/2001   Toya
9,618,954 B2    4/2017   Masuda et al.
(Continued)

FOREIGN PATENT DOCUMENTS

CN    102204004 A    9/2011
CN    102905949 A    1/2013
(Continued)

OTHER PUBLICATIONS

De Vries et al., "Increasing the cycle life of lithium ion cells by partial state of charge cycling", Microelectronics Reliability, (2015), MR-11766; pp. 1-7.
(Continued)

*Primary Examiner* — Tamara L Weber
(74) *Attorney, Agent, or Firm* — Birch, Stewart, Kolasch & Birch, LLP

(57) ABSTRACT

A battery device receives a state of charge (SOC) a SOC setting range, charge at least one battery pack, estimates a SOC based on state information of the at least one battery pack, monitors whether the estimated SOC reaches a charging reference value corresponding to an upper limit of the SOC setting range, and stops charging when it is confirmed through a result of the monitoring that the estimated SOC reaches the charging reference value. The SOC setting range may be determined based on driving information of a vehicle, and may be within a SOC limiting range in which degradation of battery cells included in the at least one battery pack is the lowest.

12 Claims, 4 Drawing Sheets

(51) Int. Cl.
*G01R 31/3842* (2019.01)
*G01R 31/392* (2019.01)
*G01R 31/396* (2019.01)
*H01M 10/42* (2006.01)

(52) U.S. Cl.
CPC ......... *G01R 31/392* (2019.01); *G01R 31/396* (2019.01); *H01M 10/425* (2013.01); *H01M 2010/4271* (2013.01); *H01M 2010/4278* (2013.01)

(56) References Cited

U.S. PATENT DOCUMENTS

| | | | |
|---|---|---|---|
| 10,170,803 | B2 | 1/2019 | Kanada |
| 2007/0145948 | A1 | 6/2007 | Lim et al. |
| 2011/0089905 | A1 | 4/2011 | Yano |
| 2011/0221400 | A1 | 9/2011 | Takizawa et al. |
| 2013/0062941 | A1 | 3/2013 | Yamamoto et al. |
| 2013/0226389 | A1 | 8/2013 | Yamazaki |
| 2014/0132214 | A1* | 5/2014 | Katanoda ................ B60L 58/15 320/109 |
| 2014/0217987 | A1 | 8/2014 | Shim et al. |
| 2014/0347012 | A1 | 11/2014 | Shim et al. |
| 2015/0134164 | A1 | 5/2015 | Choi et al. |
| 2016/0268802 | A1 | 9/2016 | Shim |
| 2016/0301234 | A1 | 10/2016 | Park et al. |
| 2016/0372800 | A1 | 12/2016 | Kanada |
| 2017/0043790 | A1 | 2/2017 | Morisaki |
| 2018/0172777 | A1 | 6/2018 | Park et al. |
| 2019/0193579 | A1* | 6/2019 | Katanoda ................ B60L 50/60 |

FOREIGN PATENT DOCUMENTS

| | | |
|---|---|---|
| CN | 104184182 A | 12/2014 |
| EP | 2 352 199 A1 | 8/2011 |
| EP | 2 572 951 A1 | 3/2013 |
| JP | 2000-228832 A | 8/2000 |
| JP | 2006-54958 A | 2/2006 |
| JP | 2008-263730 A | 10/2008 |
| JP | 2010-8218 A | 1/2010 |
| JP | 2011-87428 A | 4/2011 |
| JP | 2011-240863 A | 12/2011 |
| JP | 2013-62945 A | 4/2013 |
| JP | 2014-112980 A | 6/2014 |
| JP | 2014-153353 A | 8/2014 |
| JP | 5710775 B2 | 4/2015 |
| JP | 2015-209114 A | 11/2015 |
| JP | 2016-187967 A | 9/2016 |
| JP | 2017-10727 A | 1/2017 |
| KR | 10-2010-0064642 A | 6/2010 |
| KR | 10-1337576 B1 | 12/2013 |
| KR | 10-2014-0100086 A | 8/2014 |
| KR | 10-2016-0024296 A | 3/2016 |
| KR | 10-2016-0046550 A | 4/2016 |
| KR | 10-2016-0049604 A | 5/2016 |
| KR | 10-2016-0109271 A | 9/2016 |
| KR | 10-2016-0150420 A | 12/2016 |
| KR | 10-1850602 B1 | 4/2018 |
| KR | 10-2018-0069438 A | 6/2018 |
| WO | WO 2010/058839 A1 | 5/2010 |

OTHER PUBLICATIONS

International Search Report for PCT/KR2020/000126 (PCT/ISA/210) dated Jun. 8, 2020.

Extended European Search Report for European Application No. 20735955.5, dated Sep. 28, 2021.

* cited by examiner

BATTERY MANAGEMENT METHOD, BATTERY DEVICE, AND VEHICLE COMPRISING BATTERY DEVICE

TECHNICAL FIELD

Cross-Reference to Related Application(s)

This application claims priority to and the benefit of Korean Patent Application No. 10-2019-0001322 filed in the Korean Intellectual Property Office on Jan. 4, 2019, the entire contents of which are incorporated herein by reference.

The present disclosure relates to a battery management method, a battery device, and a vehicle including a battery.

BACKGROUND ART

A battery lifespan is affected by change in energy capacity used. The larger an energy capacity change, the greater a degree of decrease of a battery lifespan. A battery for a vehicle is supplied with power from a plurality of battery packs, and generally, power supplied to a vehicle is controlled based on a battery pack having the most deterioration among the plurality of battery packs.

In this case, a problem occurs in that use of battery packs other than the battery pack having the most severe deterioration is restricted.

That is, in the battery for the vehicle, a decrease of a lifespan of the battery limits supply of power, and causes a problem of limiting a driving time and distance of the vehicle.

DISCLOSURE

Technical Problem

The present invention has been made in an effort to provide a battery management method, a battery device, and a vehicle including a battery that may delay a decrease of a battery lifespan.

Technical Solution

An embodiment of the present invention provides a battery management method, including: receiving a SOC (state of charge) setting range; charging at least one battery pack; estimating a SOC of the at least one battery pack based on state information of the at least one battery pack; monitoring whether the estimated SOC reaches a charging reference value corresponding to an upper limit of the SOC setting range; and stopping charging when it is confirmed through a result of the monitoring that the estimated SOC reaches the charging reference value, wherein the SOC setting range may be determined based on driving information of a vehicle, and may be within a SOC limiting range, wherein the SOC limiting range is predetermined to cause a lowest degree of degradation of battery cells of the at least one battery pack.

The battery management method may further include deriving the SOC setting range based on the driving information.

The battery management method may further include: monitoring whether the estimated SOC deviates from a lower limit of the SOC setting range; and when the estimated SOC deviates from the lower limit of the SOC setting range, operating the at least one battery pack in a SOC range that is lower than the SOC setting range.

Another embodiment of the present invention a battery device, including: at least one battery pack including a plurality of battery cells connected in series; and a battery management system configured to receive a SOC setting range, estimate a SOC of the at least one battery pack based on state information of the at least one battery pack, and charge the at least one battery pack so that the estimated SOC reaches up to a charging reference value corresponding to an upper limit of the SOC setting range. The SOC setting range may be determined based on driving information of a vehicle, and may be within a SOC limiting range, wherein the SOC limiting range is predetermined to cause a lowest degree of degradation of battery cells of the at least one battery pack.

In the battery device, the SOC setting range may be derived based on the driving information.

Another embodiment of the present invention provides a vehicle including: at least one battery pack including a plurality of battery cells connected in series; a battery management system configured to receive a SOC setting range, estimate a SOC based on state information of the at least one battery pack, and charge the at least one battery pack until the estimated SOC reaches up to a charging reference value corresponding to an upper limit of the SOC setting range; and a power converting circuit that converts power from the battery device, and supplies power to an electrical load, wherein the SOC setting range may be determined based on driving information of a vehicle, and may be within a SOC limiting range, wherein the SOC limiting range is predetermined to cause a lowest degree of degradation of battery cells of the at least one battery pack.

The vehicle may further include an interface that receives the SOC setting range from a user. In addition, in the vehicle, the SOC setting range may be derived based on the driving information.

The battery device may be configured to monitor whether the estimated SOC deviates from a lower limit of the SOC setting range, and may be operated in a SOC range that is lower than the SOC setting range when the estimated SOC deviates from the lower limit of the SOC setting range.

The battery device may further include: a voltage sensing control circuit configured to measure voltages at both ends of the battery pack and transmit information on the measured voltages to the battery management system; and a current measuring part configured to measure a current flowing in the battery pack and transmit information on the measured current to the battery management system, and the state information of the battery pack may include information on the measured voltages and information on the measured current.

Advantageous Effects

According to the embodiment of the invention, it is possible to delay a decrease of a battery lifespan.

MODE FOR INVENTION

Figure 1:
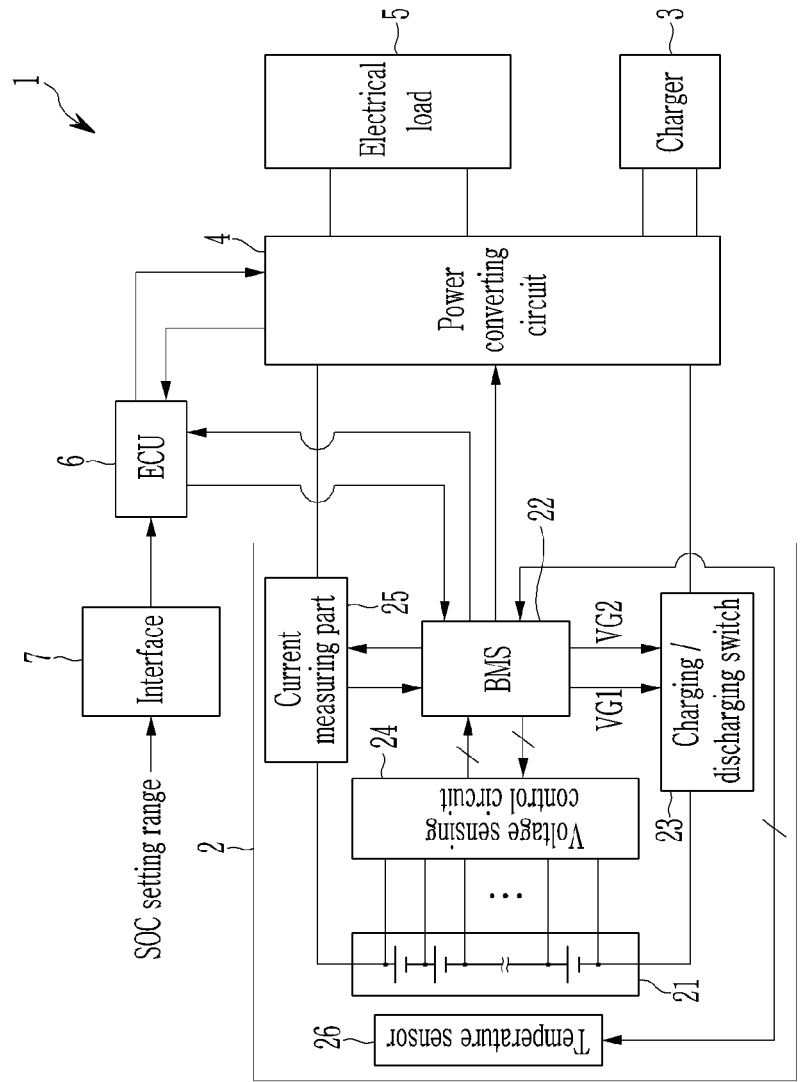
FIG. 1 illustrates a schematic view of a battery device according to an embodiment and a portion of a vehicle including the same.

The present disclosure relates to a method and device for a user to set an energy use range of a battery for a vehicle and manage the battery to the set energy use range. In an embodiment below, a state of charge (SOC) may be used as an example of an index indicating an energy use range. The SOC is an index indicating a state of charge of a battery, and may be displayed as a percentage remaining with respect to a full charge capacity (FCC) of the battery as a percentage. However, the present invention is not limited thereto. In addition, an embodiment may relate to a battery management method and a battery management device that may control charging and discharging of a battery to a set energy use range, and to a vehicle including a battery management device.

According to the embodiment of the present disclosure, it is possible to increase a lifespan of a battery for an electric vehicle by intentionally limiting a SOC range according to a user's setting or canceling the limiting.

For example, the battery may be operated within the SOC setting range in which the SOC range is limited according to driving information, and in this case, the battery may supply power to an electrical load within the SOC setting range. The driving information may include information such as a driving distance, a departure point, a destination, and a driving time. Specifically, a user may determine the SOC setting range according to the driving distance.

The SOC setting range may be canceled according to a change in circumstances, such as when the driving distance is unexpectedly extended, and the battery may be operated to a SOC that is lower than a lower limit of the SOC setting range. In addition, when the driving distance is difficult to achieve in an upper limit of the SOC setting range, the battery may be charged with a SOC that is higher than the upper limit of the SOC setting range.

Depending on characteristics of battery cells configuring the battery, there is a SOC range with a small degree of reduced lifespan (hereinafter referred to as 'deterioration'). For example, when the battery is operated in a SOC range of 30-70% rather than a SOC range of 20-80% or 10-90%, a degree of battery degradation may be the smallest. In this case, the SOC range of 30-70% is referred to as a SOC limiting range. When a user considers a driving distance, the user may set it as a SOC use range when the vehicle may be operated within the SOC range of 30-70%. The SOC use range set as described above is an example of a SOC setting range. In this case, the SOC setting range may be within the SOC limiting range of 30-70%.

According to the embodiment of the present disclosure, it is possible to charge a battery with a SOC in which a predetermined margin is added to an upper limit of the SOC setting mode according to a SOC setting mode.

Hereinafter, an embodiment in which the above-described technical spirit is implemented will be described with reference to the drawings. Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 illustrates a schematic view of a battery device according to an embodiment and a portion of a vehicle including the same.

Figure 2:
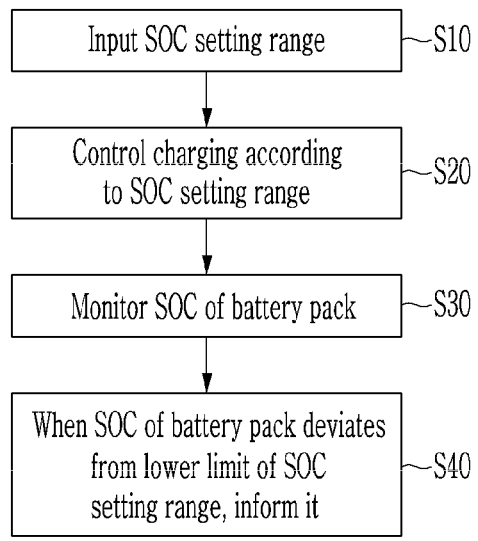
FIG. 2 illustrates a flowchart of a battery management method according to an embodiment.

FIG. 2 illustrates a flowchart of a battery management method according to an embodiment.

As shown in FIG. 1, a vehicle 1 may include a battery device 2, a power converting circuit 4, an electrical load 5, an electronic control unit (ECU) 6, and an interface 7.

The power converting circuit 4 may convert power inputted from the battery device 2 for driving the vehicle 1 to supply power required for the electrical load 5. Power conversion by the power converting circuit 4 may be controlled according to a signal instructing a power control operation of the ECU 6. The electrical load 5 may be a motor.

In addition, for charging the battery device 2, the power converting circuit 4 may convert power supplied from a charger 3 that is an external device to supply the power to the battery device 2. A power conversion operation for the charging of the battery device 2 may be controlled by the ECU 6 and/or the battery device 2. Specifically, the power converting circuit 4 may start a battery charging operation under control of the ECU 6, and receive a control signal for charging control from the battery device 2 during charging to supply power required for charging to the battery device 2. The battery device 2 may measure a voltage of a battery pack and generate a signal for controlling charging based on the measured voltage.

As such, the power converting circuit 4 may be implemented as a bi-directional inverter in order to supply power to an electric load and power to a battery device. The power converting circuit 4 may be a DC-AC inverter when supplying power to the electrical load, and an AC-DC inverter when supplying power to the battery device.

The ECU 6 is a circuit that controls electronic equipment of the vehicle 1. In the embodiment, the ECU 6 may transmit information about the SOC setting range to the battery device 2.

The interface 7 may receive a SOC setting range from a user (step S10 in FIG. 2). The SOC setting range is upper and lower charging and discharging limits of the battery device 2 inputted from the user, and may be determined within the SOC limiting range.

For example, when the user wants to move a distance of 100 km in 4 hours, the driving distance is 100 km, and the SOC setting range is the upper and lower charging and discharging limits of the battery required for driving the distance of 100 km in 4 hours. When the SOC limiting range for the battery is 30-70% and it is possible to be driven with a SOC of 30-60% under a corresponding condition, the SOC setting range may be determined as a SOC of 30-60%.

The upper charging limit may correspond to an upper limit of the SOC setting range, and the lower discharging limit may correspond to a lower limit of the SOC setting range. Accordingly, a battery pack 21 of the battery device 2 may be charged to a SOC of 60%, and discharged to a SOC of 30% after driving.

When the driving distance is a distance that cannot be driven within 30-70% of the SOC limiting range, the battery device 2 may be operated within a required SOC range in a state in which the SOC setting range is determined. That is, according to the embodiment, unlike the prior art in which deterioration of the battery cell proceeds by maintaining the SOC use range constant regardless of the driving distance, when the driving distance is a distance that may be driven within the SOC limiting range, the embodiment is an example of implementing a technical idea to maximally prevent deterioration of the battery cell by operating the battery device 2 within the SOC limiting range.

The battery device 2 includes at least one battery pack 21, a battery management system (BMS) 22, a charging/discharging switch device 23, a voltage sensing control circuit 24, a current measuring part 25, and a temperature sensor 26.

The battery pack 21 includes a plurality of battery cells connected in series. Although only one battery pack 21 is illustrated in FIG. 1, a plurality of battery packs may be connected in series or in parallel to supply necessary power.

The BMS 22 may receive the SOC setting range, estimate a SOC of the battery pack 21, and control charging and discharging of the battery pack 21 based on the estimated SOC. The BMS 22 controls a switching operation of the charging/discharging switch device 23 to control charging and discharging according to the SOC setting range.

Figure 3:
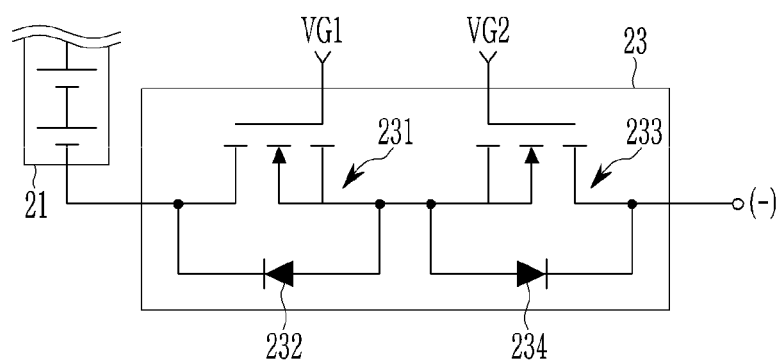
FIG. 3 illustrates a schematic view of a charging/discharging switch device.

FIG. 3 illustrates a schematic view of a charging/discharging switch device.

As shown in FIG. 3, the charging/discharging switch device 23 includes a charging switch 231 and a discharging switch 233, a body diode 232 is disposed between a source and a drain of the charging switch 231, and a body diode 234 is disposed between a source and a drain of the discharging switch 233.

The charging switch 231 and the discharging switch 233 are configured of (e.g., comprise) n-channel transistors. For charging the battery pack 21, the BMS 22 applies an on-level (high-level) gate signal VG1 to the gate of the charging switch 231, and an off-level (low-level) gate signal VG2 to the gate of the discharging switch 233. For discharging to supply power to the electrical load 5 from the battery pack 21, the BMS 22 applies the off-level (low-level) gate signal VG1 to the gate of the charging switch 231, and the on-level (high-level) gate signal VG2 to the gate of the discharging switch 233.

During a charging period, a charging current may flow through the body diode 234, and during a discharging period, a discharge current may flow through the body diode 232.

The BMS 22 controls charging of the battery pack 21 based on the upper limit of the SOC setting range, that is, the upper charging limit (step S20 in FIG. 2). In addition, the BMS 22 may monitor whether a SOC of the battery pack 21 deviates from the lower limit of the SOC setting range, that is, the lower discharging limit (step S30 in FIG. 2).

For example, the BMS 22 controls a switching operation of the charging switch 231 so that an estimated SOC of the battery pack 21 reaches a charging reference value obtained by adding a predetermined margin to the upper limit of the SOC setting range. Through charging, the SOC of the battery pack 21 may have a charging reference value before driving.

When the estimated SOC of the battery pack 21 is lower than the lower limit of the SOC setting range during driving, the BMS 22 may inform the ECU 6 of this (step S40 in FIG. 2). In this case, the battery pack 21 may supply necessary power through discharging regardless of the SOC setting range.

The voltage sensing control circuit 24 may transmit information on the battery pack 21 to the BMS 22, measure a cell voltage of the battery pack 21 according to a control signal received from the BMS 22, and perform cell balancing. For example, the voltage sensing control circuit 24 measures a plurality of cell voltages configuring the battery pack 21 during a cell voltage sensing period, and transmits information on the measured cell voltages to the BMS 22. The BMS 22 may detect a cell that needs cell balancing among a plurality of cells based on the received information on the measured cell voltages, and transmits information on the detected cell and on a target cell voltage to the voltage sensing control circuit 24. The voltage sensing control circuit 24 may perform the cell balancing by discharging a corresponding cell to the target cell voltage based on the received information.

The BMS 22 may detect an abnormal cell based on the received information on the measured cell voltages and, if necessary, activate a protective operation. Although not shown in FIG. 1, if necessary, the information on the measured cell voltages may be stored in a memory, or may be stored in a memory provided in the voltage sensing control circuit 24.

The current measuring part 25 transmits a measured battery pack current to the BMS 22, and measures the battery pack current according to control of the BMS 22. The BMS 22 may continuously measure a current flowing through the battery pack 22 to perform SOC estimation. In addition, the battery pack current must be measured to detect whether the battery pack 22 is abnormal. Information on the measured battery pack current may be stored in a separate memory. The current measuring part 25 may be realized as a Hall sensor or a sense resistor.

The temperature sensor 26 may measure a temperature of the battery pack 21, and transmit information on the measured temperature to the BMS 22. The temperature sensor 26 may measure the temperature according to control of the BMS 22. The temperature sensor 26 may be realized as a thermistor.

The BMS 22 estimates a SOC of a current battery pack 21 and monitors a current SOC. When the SOC setting range is inputted, the BMS 22 may charge the battery pack 21 to increase the current SOC of the battery pack 22 to the charging reference value based on the upper limit of the SOC setting range. In addition, when the current SOC of the battery pack 21 is lowered to a predetermined threshold, the BMS 22 may activate a protective operation to prevent the battery pack 21 from being completely discharged.

SOC estimating methods are various, and include conventionally known methods. The present invention is not limited to any particular method, but one method is introduced to describe one embodiment.

Figure 4:
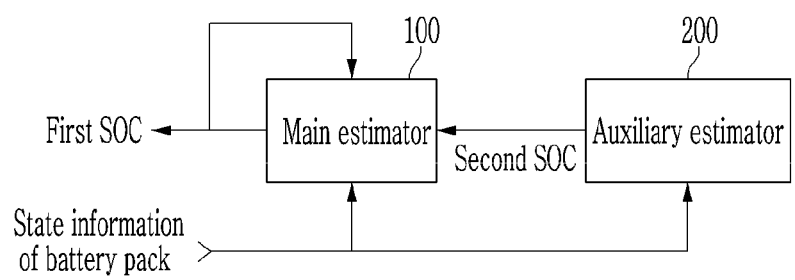
FIG. 4 illustrates a block diagram of a configuration for estimating SOC by a BMS according to an embodiment.

FIG. 4 illustrates a block diagram of a configuration for estimating SOC by a BMS according to an embodiment.

As shown in FIG. 4, the BMS 22 according to the embodiment may include a main estimator 100 and an auxiliary estimator 200.

The BMS 22 may receive a battery pack current, a battery pack voltage, and a battery pack temperature as state information of the battery pack. The state information of the battery pack may mean various information related to a physical or chemical condition of the battery pack.

When the battery pack 21 is charged or discharged, the current measuring part 25 may measure an amount of the charging or discharging current flowing in a charging/discharging path of the battery pack, and may transmit information thereon to the BMS 22. The voltage sensing control circuit 24 may measure a terminal voltage between positive and negative terminals of the battery pack 2 and transmit it to the BMS 22. The temperature sensor 26 may transmit a temperature of the battery pack 21 to the BMS 22.

The main estimator 100 and the auxiliary estimator 200 according to the embodiment may be implemented of a multi-core provided in a micro-controller unit (MCU) of the BMS 22.

The main estimator 100 and the auxiliary estimator 200 may separately estimate a SOC through each SOC estimation operation based on the received state information of the battery pack.

The main estimator 100 may estimate a SOC (hereinafter, a first SOC) by using a first battery modeling method, while the auxiliary estimator 200 may estimate a SOC (hereinafter, a second SOC) by using a second battery modeling method, and the first and second battery modeling methods may be different. The battery modeling method is used to estimate a state of a battery having non-linear characteristics, and may include an electrical circuit model, an electrochemical model, an analytical model, and a stochastic model.

Specifically, the main estimator 100 may estimate the first SOC of a current step based on information included in a SOC and state information of the battery pack estimated in an immediately previous step by using the electrical circuit model as the first battery modeling method. The auxiliary estimator 200 may use an electrochemical model as the second battery modeling method.

The electrical circuit model is a method of modeling input and output characteristics of a battery with an equivalent circuit implemented as an electrical circuit. Since the electrical circuit model may relatively simply perform a calculation process for the SOC estimation, it has an advantage in that a time required for calculation is not long and a load for calculation is not large. However, there is a problem that accuracy of the electrical circuit model is somewhat deficient.

Meanwhile, the electrochemical model is a method of modeling characteristics of the battery based on a chemical reaction occurring inside the battery. A representative example of the electrochemical model may be a Doyle-Fuller-Newman (DFN) model. The DFN model may model spatial and temporal changes of a lithium ion concentration in a porous electrode, a potential, intercalation kinetics, a current density between a solid phase and an electrolyte phase, and the like. The electrochemical model has very high accuracy.

The auxiliary estimator 200 may obtain a highly accurate SOC estimation value (second SOC) based on the state information of the battery pack by using the electrochemical model such as the DFN model. In addition, the main estimator 100 may increase the accuracy of the SOC (first SOC) estimation by reflecting the SOC estimation result (second SOC) of the auxiliary estimator 200 having such high accuracy on an input parameter. The auxiliary estimator 200 may periodically transmit the estimation result of the second SOC to the main estimator 100.

For example, the main estimator 100 may recognize the second SOC value transmitted from the auxiliary estimator 200 as the first SOC of the immediately previous step, and may estimate the first SOC the current step by applying the state information of the received battery pack and the first SOC of the immediately previous step to the first battery modeling method. Thus, the first SOC value estimated by the main estimator 100 may be periodically corrected to periodically prevent an increase in an error of the first SOC estimation, thereby improving the accuracy of the SOC estimation. As such, the BMS 22 may estimate the SOC in real time, and monitor whether the estimated SOC reaches the upper limit of the SOC setting range or exceeds the lower limit of the SOC setting range. Specifically, the BMS 22 may receive the SOC setting range, set the charging reference value based on the upper limit of the SOC setting range, and estimate the SOC in real time after charging starts to monitor whether the estimated SOC reaches the charging reference value. When the estimated SOC reaches the charging reference value, the BMS 22 may stop charging and inform the ECU 6 of that.

In the embodiment, the battery device is operated according to the SOC setting range determined by the user. When the SOC setting range is inputted from the user through the interface 7, the user may select the SOC setting range based on user's driving experience. In this case, the SOC setting range may be immediately transmitted to the ECU 6 or the BMS 22 of the battery device 2. However, the present invention is not limited thereto, and the SOC setting range may be derived based on the driving information.

In this case, the interface 7 receives the driving information from the user, and the ECU 6 may transmit the driving information to the battery device 2. Alternatively, the driving information may be transmitted from the interface 7 to the battery device 2.

The battery device 2 may derive the SOC setting range based on the driving information. For example, a database in which the driving distance and SOC setting range are inputted from the user through the interface 7 and stored therein may be built, and connected to the BMS 22. The BMS 22 may derive the SOC setting range corresponding to the inputted driving distance from the database. For example, the BMS 22 may set a driving distance range included in a predetermined range based on the inputted driving distance, derive SOC setting ranges of the database included in the set driving distance range, and determine a SOC setting range through a statistical method for the derived SOC setting ranges. As the statistical method, various methods such as average value deriving and representative value deriving may be used.

The method of deriving the SOC setting range based on the driving distance is not limited to the above. In the deriving of the SOC setting range, the SOC setting range may be derived in consideration of the driving distance as well as other information. For example, it is possible to calculate a driving distance by reflecting navigation information based on a departure point, a destination, and a driving time on a driving route. That is, even in a case in which the departure point and the destination are the same, since traffic conditions are different depending on the driving time, it is possible to calculate a driving distance reflecting this. The SOC setting range may be derived based on the driving distance calculated in this manner.

When the BMS 22 receives the driving distance, the deriving of the SOC setting range of the battery device 2 described above may be performed by the BMS 22. Alternatively, although not shown in FIG. 1, the battery device 2 may include a separate configuration to derive the SOC setting range from the driving distance.

Although it is described that the battery device 2, for example the BMS 22 of the battery device 2, derives the SOC setting range from the driving information, the present invention is not limited thereto. The BMS 22 may receive the SOC setting range derived in the above manner from a separate configuration outside the battery device 2 or from the ECU 6.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A battery management method, comprising:
receiving a state of charge (SOC) setting range;
charging at least one battery pack;
estimating, by a micro-controller unit (MCU) of a battery management system (BMS), a SOC of the at least one battery pack based on state information of the at least one battery pack;
monitoring whether the estimated SOC reaches a charging reference value corresponding to an upper limit of the SOC setting range; and
stopping charging when it is confirmed through a result of the monitoring that the estimated SOC reaches the charging reference value,
wherein the SOC setting range is determined based on driving information of a vehicle, and is within a SOC limiting range, wherein the SOC limiting range is predetermined to cause a lowest degree of degradation of battery cells of the at least one battery pack,
wherein the estimating the SOC includes:
estimating a first SOC, via a main estimator, using a first battery modeling method; and
estimating a second SOC, via an auxiliary estimator, using a second battery modeling method,
wherein the first battery modeling method estimates the first SOC of a current step based on information included in a SOC and state information of the at least one battery pack estimated in an immediately previous step by using an electrical circuit model, and
wherein the second battery modeling method uses an electrochemical model based on a chemical reaction occurring inside the at least one battery pack.

2. The battery management method of claim 1, further comprising deriving the SOC setting range based on the driving information.

3. The battery management method of claim 1, further comprising:
monitoring whether the estimated SOC deviates from a lower limit of the SOC setting range; and
when the estimated SOC deviates from the lower limit of the SOC setting range, operating the at least one battery pack in a SOC range that is lower than the SOC setting range.

4. A battery device, comprising:
at least one battery pack including a plurality of battery cells connected in series; and
a battery management system (BMS) configured to:
receive a state of charge (SOC) setting range,
estimate, via a micro-controller unit (MCU) of the BMS, a SOC of the at least one battery pack based on state information of the at least one battery pack, and
charge the at least one battery pack so that the estimated SOC reaches up to a charging reference value corresponding to an upper limit of the SOC setting range,
wherein the SOC setting range is determined based on driving information of a vehicle, and is within a SOC limiting range, wherein the SOC limiting range is predetermined to cause a lowest degree of degradation of battery cells of the at least one battery pack,
wherein the estimating the SOC includes:
estimating a first SOC, via a main estimator, using a first battery modeling method; and
estimating a second SOC, via an auxiliary estimator, using a second battery modeling method,
wherein the first battery modeling method estimates the first SOC of a current step based on information included in a SOC and state information of the at least one battery pack estimated in an immediately previous step by using an electrical circuit model, and
wherein the second battery modeling method uses an electrochemical model based on a chemical reaction occurring inside the at least one battery pack.

5. The battery device of claim 4, wherein
the SOC setting range is derived based on the driving information.

6. The battery device of claim 4, wherein
the battery device is configured to monitor whether the estimated SOC deviates from a lower limit of the SOC setting range, and
when the estimated SOC deviates from the lower limit of the SOC setting range, the battery device is configured to be operated in a SOC range that is lower than the SOC setting range.

7. The battery device of claim 4, further comprising:
a voltage sensing control circuit configured to measure voltages at both ends of the at least one battery pack, and transmit information on the measured voltages to the battery management system; and
a current measuring sensor configured to measure a current flowing in the at least one battery pack and transmit information on the measured current to the battery management system,
wherein the state information of the at least one battery pack includes information on the measured voltages and information on the measured current.

8. A vehicle comprising a battery device including:
at least one battery pack including a plurality of battery cells connected in series;
a battery management system (BMS) configured to:
receive a state of charge (SOC) setting range,
estimate, via a micro-controller unit (MCU) of the BMS, a SOC of the at least one battery pack based on state information of the at least one battery pack, and
charge the at least one battery pack until the estimated SOC reaches up to a charging reference value corresponding to an upper limit of the SOC setting range; and
a power converting circuit that converts power from the battery device, and supplies power to an electrical load,
wherein the SOC setting range is determined based on driving information of a vehicle, and is within a SOC limiting range, wherein the SOC limiting range is predetermined to cause a lowest degree of degradation of battery cells of the at least one battery pack,
wherein the estimating the SOC includes:
estimating a first SOC, via a main estimator, using a first battery modeling method; and
estimating a second SOC, via an auxiliary estimator, using a second battery modeling method,
wherein the first battery modeling method estimates the first SOC of a current step based on information included in a SOC and state information of the at least one battery pack estimated in an immediately previous step by using an electrical circuit model, and
wherein the second battery modeling method uses an electrochemical model based on a chemical reaction occurring inside the at least one battery pack.

9. The vehicle of claim 8, further comprising an interface that receives the SOC setting range from a user.

10. The vehicle of claim 8, wherein the battery device is configured to:
monitor whether the estimated SOC deviates from a lower limit of the SOC setting range, and
operate in a SOC range that is lower than the SOC setting range when the estimated SOC deviates from the lower limit of the SOC setting range.

11. The vehicle of claim 8, wherein the SOC setting range is derived based on the driving information.

12. The vehicle of claim 8, wherein the battery device further includes:
a voltage sensing control circuit configured to measure voltages at both ends of the at least one battery pack and transmit information on the measured voltages to the battery management system; and
a current measuring sensor configured to measure a current flowing in the at least one battery pack and transmit information on the measured current to the battery management system, and
wherein the state information of the at least one battery pack includes information on the measured voltages and information on the measured current.

* * * * *